(12) United States Patent
Kim et al.

(10) Patent No.: US 7,818,642 B2
(45) Date of Patent: Oct. 19, 2010

(54) HIERARCHICAL TEST RESPONSE COMPACTION FOR A PLURALITY OF LOGIC BLOCKS

(75) Inventors: Kee Sup Kim, El Dorado Hills, CA (US); Ming Zhang, Sunnyvale, CA (US); Avi Kovacs, Haifa (IL)

(73) Assignee: Intel Corporation, Santa Clara, CA (US)

( * ) Notice: Subject to any disclaimer, the term of this patent is extended or adjusted under 35 U.S.C. 154(b) by 409 days.

(21) Appl. No.: 11/903,913

(22) Filed: Sep. 25, 2007

(65) Prior Publication Data

US 2009/0083599 A1 Mar. 26, 2009

(51) Int. Cl.
*G01R 31/3177* (2006.01)
*G01R 31/302* (2006.01)

(52) U.S. Cl. .................................. 714/729; 714/724
(58) Field of Classification Search .................. None
See application file for complete search history.

(56) References Cited

U.S. PATENT DOCUMENTS

| 3,787,814 | A  | * | 1/1974  | Pages ........................ 710/316 |
| 7,185,253 | B2 |   | 2/2007  | Mitra et al. ................. 714/734 |
| 2004/0249615 | A1 | * | 12/2004 | Grzeszczuk et al. ............ 703/2 |
| 2007/0079300 | A1 | * | 4/2007  | Du et al. ..................... 717/149 |

FOREIGN PATENT DOCUMENTS

SU          1196844    A    *  12/1985

* cited by examiner

*Primary Examiner*—Kevin L Ellis
*Assistant Examiner*—Dipakkumar Gandhi
(74) *Attorney, Agent, or Firm*—Trop, Pruner & Hu, P.C.

(57) ABSTRACT

In one embodiment, the present invention includes first level matrices, each including m input terminals and n output terminals, each coupled to a processor core, and second level matrices each coupled to the n output terminals of one of the first level matrices, where each of the second level matrices has n input terminals and p output terminals, and the p output terminals of the second level matrices correspond to a compacted output from the multiple processor cores. Other embodiments are described and claimed.

13 Claims, 2 Drawing Sheets

HIERARCHICAL TEST RESPONSE COMPACTION FOR A PLURALITY OF LOGIC BLOCKS

BACKGROUND

Integrated circuits include input pins for receiving signals from the outside world and output pins for providing signals to the outside world. Since integrated circuit packages are advantageously compact, increasing the number of pins means increasing the integrated circuit packaging size and cost.

For example, when testing integrated circuits, a number of modules or components may be scanned or analyzed for errors or defects. The more scan chains of modules to be analyzed, generally the more pins that are needed to receive signals from those scan chains. Conversely, the longer the scan chains, the slower the testing process. Either way, the costs may be aggravated.

Single level compaction has been used to achieve up to an order of compaction in the number of scan output pins that need to be observed. A single level compactor is difficult to extend to devices having multiple cores or for system on chip (SOC) designs.

DETAILED DESCRIPTION

In various embodiments for multi-core or SOC designs, individual blocks, also referred to herein as intellectual property (IP) cores, each include its own test compaction, while a second level of compaction is provided at full chip level. The first level compactors, which are made of combinational exclusive-OR (XOR) gates or other logic, and are referred to herein as an X-compact matrix, are first constructed. If there is combinational path from bit i (of a scan output, which is the input from the logic block (e.g., a scan output thereof) into the compactor) to bit j (of the output of the compactor), a 1 will be placed in the matrix location (i, j), and a 0 will be placed otherwise. By observing the characteristics described in Table 1, the X-compactor can be designed to tolerate a single unknown (X), two errors and all odd number of errors.

TABLE 1

| Feature Needed | Matrix Characteristics | Reason |
| --- | --- | --- |
| Single Error on any output detectable | Each row has at least one 1 | Each scan output is connected to at least one of the outputs. |
| Any two errors detectable | Each row is unique | Any logical XOR of two rows will not result in all 0. |
| All odd # of errors detectable | Each row has odd # of 1's | Any odd # of rows cannot be added to all 0. |
| One X tolerable | Each row has the same number of 1's | For any given two rows, there will be one column where one row is 1 and the other is 0, and vice versa. |

This response compactor may receive inputs from a plurality of circuit elements. Each of the circuit elements may be any of a variety of circuit elements, components or modules. Each circuit element receives an input such as inputs 1 to m and provides an output that may be provided to the response compactor. The response compactor, which may be a linear network containing combinational or sequential logic such as exclusive OR or AND OR gates, provides a series of outputs 1 to n. In accordance with one embodiment of the present invention, the number of outputs is substantially less than the number of circuit elements or the number of inputs provided to the response compactor from those circuit elements.

In the ensuing discussion, examples are provided in connection with circuits for testing integrated circuits. In such cases, a scan chain may be analyzed by providing a stimulus to the scan chain and receiving its output. In many complex integrated circuits, a large number of scan chains each may be provided with a stimulus. The responses of those scan chains may be collected. In accordance with some embodiments of the present invention, the number of outputs that are provided to pins or other connectors may be reduced using a hierarchical compactor. However, the present invention is not limited to testing embodiments and is applicable to a wide variety of integrated circuits.

Figure 1:
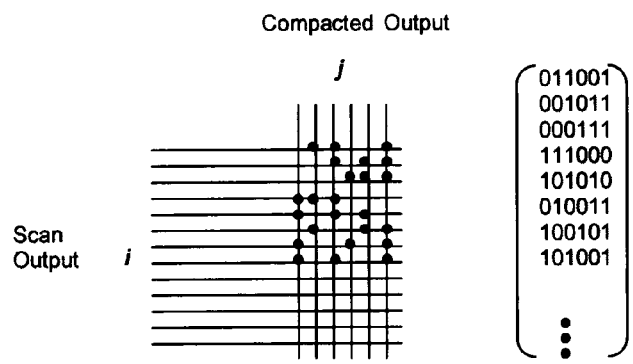
FIG. 1 is a block diagram of a first level compactor and a corresponding matrix in accordance with one embodiment of the present invention.

FIG. 1 shows a block diagram of a first level compactor and a corresponding matrix. Let us suppose that we have a core design with m scan chains. Hence, the first level compactor design will have m inputs. Suppose that the compactor has n outputs. A first level compactor design can be represented as a binary matrix (matrix with only zeros and ones) with m rows and n columns. Each row corresponds to a scan chain and each column corresponds to a compactor output. The entry in row i and column j of the binary matrix is 1, if the ith scan chain output is one of the inputs that are exclusive OR-ed to generate the jth output of the compactor; the matrix entry is 0 otherwise. As shown in FIG. 1, a dot at the intersection of a row and column corresponds to a logic one in the corresponding matrix, while the lack of a dot corresponds to a logic zero.

However, if two first level or X-compactors were used in this fashion, the first compactor can generate many error signals which will be fed into the second level compactor and aliasing may block out error signals. For example, two errors into the first compactor can translate into six errors going into the second level compactor, exceeding the design limit of the compactor. Or a single X into the first level compactor can feed three X's into the second compactor, easily exceeding the design limit of the second compactor.

Embodiments thus introduce two level compaction logic which preserves the same X and multi-error tolerance as a single level X-compactor. Embodiments also handle identical cores, where there is much higher chance of multiple errors and X's.

Figure 2:
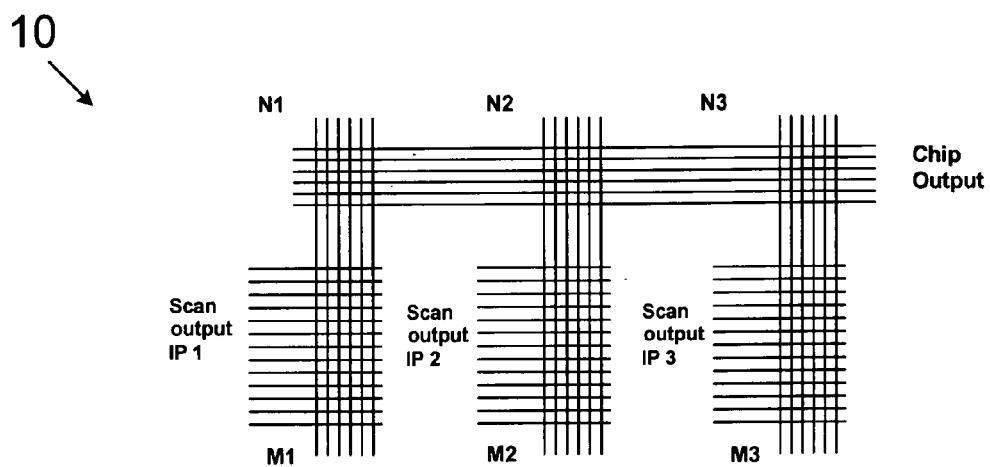
FIG. 2 is a block diagram of a hierarchical test response compactor for logic blocks in accordance with one embodiment of the present invention.

FIG. 2 is a block diagram of a hierarchical test response compactor for IP blocks in accordance with one embodiment of the present invention. As shown in FIG. 2, a semiconductor device 10 includes a plurality of first level matrices M1-M3, each of which is coupled to receive outputs such as scan chain outputs from a given IP block, namely IP blocks IP1-IP3. Note that the IP blocks may be heterogeneous, and may even correspond to different designs from different vendors that are integrated on a single die. Each matrix M (generically) compacts these scan outputs received as inputs through the matrices in accordance with a given XOR tree implementation. The outputs of the compactors M are in turn provided to second level matrices N1-N3. The outputs of matrices N1-N3 correspond to the chip level outputs from device 10. The matrices M thus represent the first level of compactors, which can reside within each individual IP block. The matrices N represent the second level of compactors, which reside on the chip to join the responses of all IP blocks. All matrices correspond to a unique XOR tree implementation, where an entry of one in row i and column j of the matrix indicates that the jth compactor output depends on output of the ith scan chain.

To design hierarchical compaction, a virtual matrix X can be built as follows:

$x_{il}=1$ if $m_{ik}=1 \&\& n_{kl}=1$, and $x_{il}=0$ otherwise.

Where $m_{ik}=1$ and $n_{kl}$ are elements of the sub-matrices M's and N's.

$$X = \begin{bmatrix} M_1 N_1 \\ M_2 N_2 \\ \vdots \\ M_t N_t \end{bmatrix}$$

In other words, the overall matrix X is a Boolean multiplication of the first level matrices M's and the second level matrices N's. This allows us to design the M's and N's matrices such that matrix X meets the X-compactor requirement as shown in Table 1. For predefined IP blocks where M is already designed, this can be done without changing the M's matrices on the IP blocks. The number of outputs of the second level matrices may be substantially less than the combined number of outputs of the first level matrices and less than the number of inputs into the first level matrices.

When multiple, identical cores are present in a design, the first level compactor matrix needs to remain the same among the identical cores. In other words, the row and column values of the M matrices are identical. This places additional constraints on the compaction matrix generation. Another factor to consider is that if there are any systematic errors, such as critical path or Design for Manufacturability (DFM) guideline violation sites that are more likely to fail across a number of the cores, special considerations need to be given so that the likelihood of multiple errors are reduced. By placing pipeline stages between the second matrices, which we will call T's for multi-core cases, the possible aliasing caused by the fact that the cores are identical is avoided.

Figure 3:
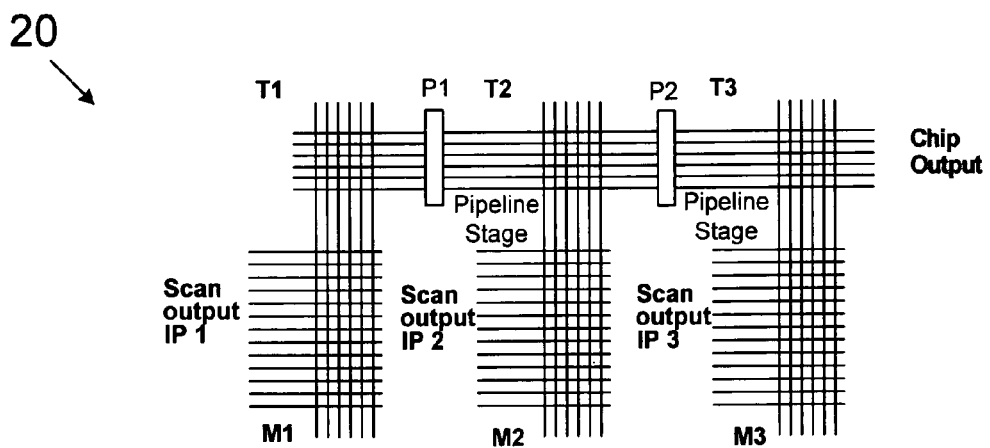
FIG. 3 is a block diagram of a hierarchical compactor in accordance with one embodiment of the present invention.

FIG. 3, which is a block diagram of a hierarchical compactor for an embodiment used in connection with multiple identical cores, shows the protection provided by embodiments of the present invention. As shown in FIG. 3, multiple first level matrices M1-M3 are provided, each of which to compact scan output responses from a corresponding identical IP core IP1-IP3. In the embodiment of FIG. 3, each IP core may be an identical processor core such as of a many-core processor 20, although the scope of the present invention is not limited in this regard. In turn, the compacted outputs of matrices M1-M3 are provided to a corresponding second level matrix, referred to as matrices T1-T3. Note that between the second level matrices T1 and T2, and T2 and T3, pipeline stages P1 and P2 are present. Pipeline stages P1 and P2 may be used to provide a predetermined delay. While pipeline stages P1-P3 may be logic to shift the inputs to the second level matrices T from each core, in some embodiments, the stages may be delay stages, such as a one-cycle delay stage. Since all M's are the same in one embodiment, the T matrices may be designed to make them work as follows: T is a square matrix with one 1 in each row and one 1 in each column. For each T matrix constructed this way, in effect a column shift operation occurs. In other words, the columns of the M matrix connected to a given T are shuffled. If matrices M have K columns, then there are K! (factorial) ways of ordering the columns. Thus each second level matrix T has different row and column values. After finding different T's for each M, the compactor matrix X for the full chip can be constructed as:

$$X = \begin{bmatrix} MT_1 \\ MT_2 \\ \vdots \\ MT_t \end{bmatrix}$$

Since each row of M has odd and equal number of 1's each row of the X matrix also has odd and equal number of 1's. If each row of X is unique, it thus meets all of X-compact requirements for single X tolerance.

Figure 4:
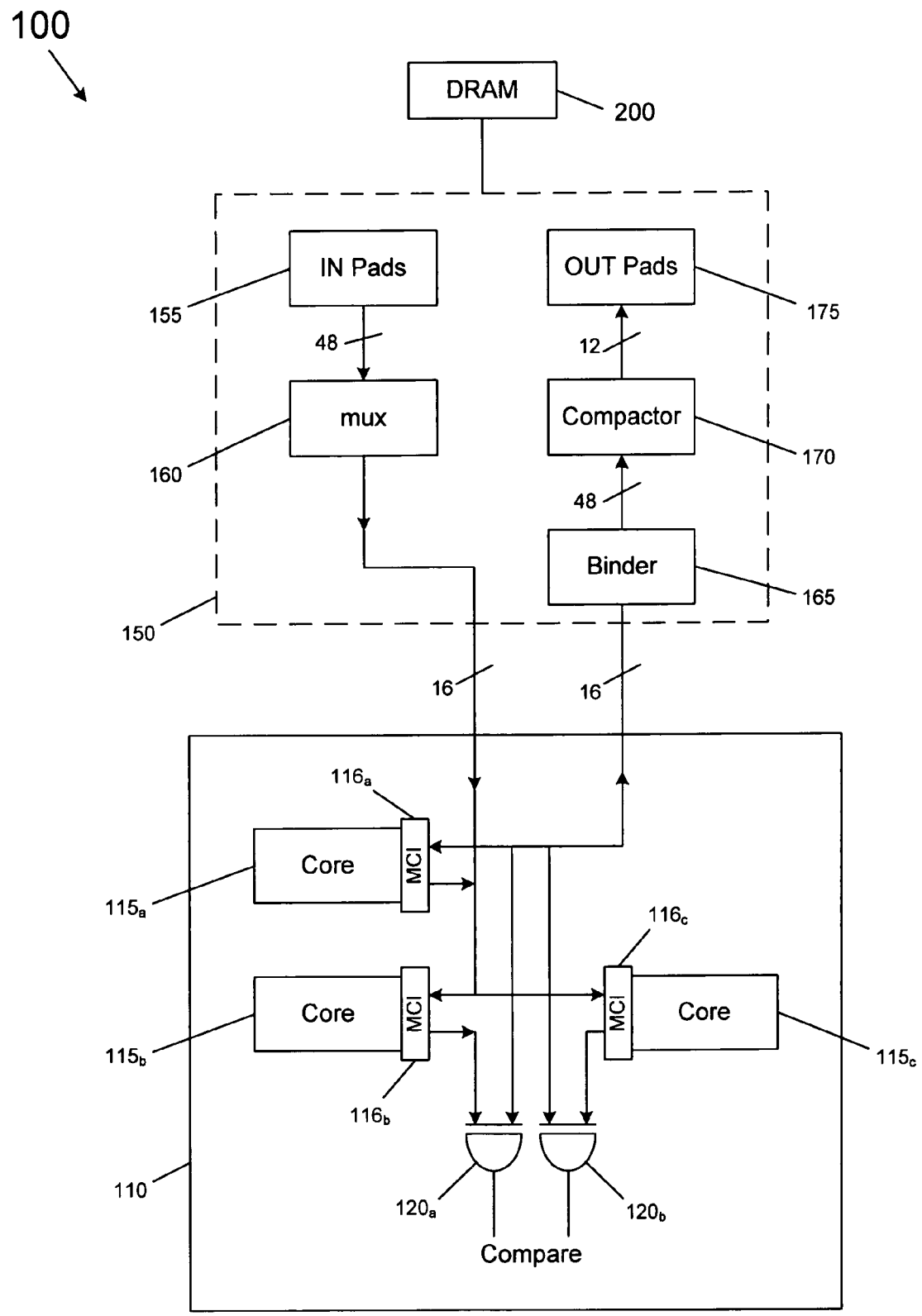
FIG. 4 is a block diagram of a hierarchical compactor used in a processor in accordance with an embodiment of the present invention.

Referring now to FIG. 4, shown is a block diagram of a hierarchical compactor used in a processor in accordance with an embodiment of the present invention. As shown in FIG. 4, processor 100 includes a core unit 110, itself including a plurality of cores $115_a$-$115_c$ (generically core 115), each of which includes a memory controller interface $116_a$-$116_c$ (generically memory controller interface 116). While not shown for ease of illustration, each core 115 includes a first level compactor in accordance with an embodiment of the present invention. As also shown in FIG. 4, core 110 may further include compare logic such as a plurality of XOR gates $120_a$-$120_b$ coupled to outputs of the individual cores.

Using these components, communication may occur between cores 115 as well as between core 110 and a remaining portion 150, also on a part of the same chip as processor 100, which provides an interface to other system components such as a corresponding memory such as a dynamic random access memory (DRAM) 200, e.g., a double data rate (DDR) memory, although the scope of the present invention is not limited in this regard. Incoming data from memory to core 110 may be received in portion 150 through input pads 155, which are coupled to a multiplexer 160, which in turn selects to which of cores 115 the data is to be provided. In the output direction, data from core 110 is provided through a binder 165, which takes data from the multiple cores and provides it to a compactor 170, which may be a second level compactor in accordance with an embodiment of the present invention, that in turn provides a lesser number of outputs.

In the example of FIG. 4, the first level compactors of cores 115 may each output 16 bits, which are combined in binder 165 into 48 bits. Compactor 170 then reduces the number of outputs to 12 bits from the incoming 48 bits, which are then provided to output pads 175 and coupled to a location off chip, such as a memory. Note that in a given processor, multiple cores 110 and portions 150 may be coupled together such that each core 110 includes multiple first level matrices M and each portion 150 includes a given second level matrix T, which can be combined using pipeline stages in accordance with an embodiment of the present invention.

Hierarchical compaction techniques in accordance with an embodiment of the present invention thus enable the following: allows hierarchical design of compactors rather than a single level flat design; second-level compaction matrices can be designed independently of the first-level matrices, which is especially useful to scenarios where IP blocks are provided by external vendors; eliminates test response aliasing in multiple identical cores and allows for handling of X's in the response; a process and architecture scalable solution for future process technologies and multi-core/SoC designs, as a solution on matrix X satisfying X-compact requirement is always theoretically possible; and enables simple lookup table-based diagnosis on the tester itself, requiring no separate flows and allowing for quick repair or configuration based on defective core data.

Embodiments may be implemented in code and may be stored on a storage medium having stored thereon instructions which can be used to program a system to perform the instructions. The storage medium may include, but is not limited to, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
a plurality of first level matrices, each first level matrix including m input terminals and n output terminals, each first level matrix having a row for each of a plurality of circuit elements of a corresponding logic block of the apparatus that provides an input into one of the m input terminals and a column for each of the n output terminals, all of the first level matrix rows being non-zero and each of the rows being different from each other, wherein all of the first level matrix rows have an odd number of one values;
a plurality of second level matrices each coupled to the n output terminals of one of the first level matrices, wherein each of the second level matrices has n input terminals and p output terminals, wherein the output terminals correspond to an output from the apparatus and the number of p output terminals is substantially less than the combined number of the n output terminals; and
a pipeline stage coupled between each of the plurality of second level matrices to shift inputs to a corresponding second level matrix from one of the corresponding logic blocks.

2. The apparatus of claim 1, wherein each of the corresponding logic blocks is an identical core.

3. The apparatus of claim 2, wherein all of the matrix rows of the first level matrices each have an equal number of one values.

4. The apparatus of claim 3, wherein each of the second level matrices is a square matrix having a single one value in each row and a single one value in each column.

5. The apparatus of claim 4, wherein each of the first level matrices includes identical row and column values, and each of the second level matrices includes different row and column values.

6. The apparatus of claim 1, wherein the output of the apparatus is a Boolean multiplication of the first level matrices and the second level matrices, and wherein p is less than n.

7. A system comprising:
a processor including a plurality of cores, each core including a first level matrix having m input terminals and n output terminals, each first level matrix having a row for each of a plurality of circuit elements of the core coupled to the m input terminals and a column for each of the n output terminals, all of the matrix rows being non-zero and each of the rows being different from each of the other rows, the processor further including a plurality of second level matrices each coupled to the n output terminals of one of the first level matrices via a pipeline stage coupled between each of the plurality of second level matrices, wherein each of the second level matrices has n input terminals and p output terminals; and
a dynamic random access memory (DRAM) coupled to the processor.

8. The system of claim 7, wherein each of the plurality of cores is an identical core.

9. The system of claim 8, wherein all of the matrix rows of the first level matrices each have an equal number of one values.

10. The system of claim 9, wherein each of the second level matrices is a square matrix having a single one value in each row and a single one value in each column.

11. The system of claim 10, wherein each of the first level matrices includes identical row and column values, and each of the second level matrices includes different row and column values.

12. The system of claim 7, wherein the output of the processor is a Boolean multiplication of the first level matrices and the second level matrices, and wherein p is less than n.

13. The system of claim 7, further comprising a binder coupled between the first level matrices and the second level matrices, wherein the binder is to receive n bits from each of the plurality of cores, and the second level matrices are to output p bits.

* * * * *